United States Patent
De Groot

(10) Patent No.: US 7,043,121 B2
(45) Date of Patent: May 9, 2006

(54) METHOD AND APPARATUS FOR WRITING APODIZED PATTERNS

(75) Inventor: Peter J. De Groot, Middletown, CT (US)

(73) Assignee: Zygo Corporation, Middlefield, CT (US)

( * ) Notice: Subject to any disclaimer, the term of this patent is extended or adjusted under 35 U.S.C. 154(b) by 399 days.

(21) Appl. No.: 10/310,205

(22) Filed: Dec. 5, 2002

(65) Prior Publication Data

US 2003/0156791 A1 Aug. 21, 2003

Related U.S. Application Data

(60) Provisional application No. 60/337,890, filed on Dec. 6, 2001.

(51) Int. Cl.
*G02B 6/34* (2006.01)
(52) U.S. Cl. ....................................... 385/37
(58) Field of Classification Search ................ 385/37
See application file for complete search history.

(56) References Cited

U.S. PATENT DOCUMENTS

| 5,718,738 A | 2/1998 | Kohnke et al. ................. 65/31 |
| 6,130,973 A * | 10/2000 | Lauzon et al. ................. 385/37 |
| 6,169,830 B1 * | 1/2001 | Kewitsch et al. ............. 385/37 |

OTHER PUBLICATIONS

Kashyap, "Fiber Bragg Gratings," Academic Press (San Diego), 1999, pp. 195-226.
Strasser et al., Post Deadline Paper, Part A, Paper PD8, OFC '96, San Jose, CA, 1996.
Hill et al., "Bragg gratings fabricated . . . ," Appl. Phys. Lett., 62(10):1035-1037, 1993.

* cited by examiner

*Primary Examiner*—Karl D. Frech
*Assistant Examiner*—Jamara A. Franklin
(74) *Attorney, Agent, or Firm*—Fish & Richardson P.C.

(57) ABSTRACT

In some aspects, the invention relates to methods and systems for creating apodized periodic structures, such as apodized gratings in fibers. To create the periodic structures, a photosensitive medium is exposed to a spatially-varying radiation pattern. During the exposure, the position of the radiation pattern can oscillate with the respect to the photosensitive medium, thereby changing the average local refractive index of the medium. These methods and systems may be used to create regular structures in any appropriate medium, such as doped glasses and photosensitive polymers.

45 Claims, 3 Drawing Sheets

METHOD AND APPARATUS FOR WRITING APODIZED PATTERNS

CROSS-REFERENCE TO RELATED APPLICATIONS

This application claims priority to Provisional Patent Application No. 60/337,890, entitled "METHOD AND APPARATUS FOR WRITING APODIZED PATTERNS," by Peter de Groot, filed on Dec. 6, 2001.

BACKGROUND

This invention relates to optical components and methods for their manufacture.

Many optical components, such as optical waveguides, utilize diffractive and/or periodic structures. One example is a fiber Bragg grating ("FBG"), which has a periodic variation in index along its length to provide, for example, selective reflection of specific wavelengths. The periodic variation is typically on the order of the reflection wavelength. FBG devices have many potential uses in the established and emerging fields of optical communications and optical fiber sensing. For example, FBG's can be used for dispersion compensation and laser amplifier gain equalization.

A Bragg grating writer ("BGW") is a system for imprinting the index variation for an FBG or similar optical waveguide device. Referring to FIG. 1, an example of a BGW geometry is one that relies on a phase mask 110 in near contact with an optical fiber 120. In some embodiments, phase mask 110 may be a transmission diffraction grating optimized for diffracting incident illumination into +1 and −1 orders. When illuminated with radiation 115 from an appropriate source, phase mask 110 generates an exposure pattern having a spatially-varying intensity on a photosensitive fiber core 140 of optical fiber 120. The refractive index of the photosensitive fiber core responds to the spatially-varying exposure pattern, resulting in a refractive index modulation having an amplitude typically of about $10^{-4}$ to $10^{-3}$.

SUMMARY

In some FBG's, the index modulation is apodized, meaning that the amplitude of the refractive index modulation is not constant along the length of the grating. For example, the modulation amplitude can taper off near the beginning and end of the FBG. It is often desirable that apodization leave the average index the same throughout the grating. This is because wavelengths of light reflected by the grating depend on the average grating index, and a variation in the average index can cause a corresponding variation in the reflected wavelengths. Thus, an FBG with a varying average index can perform less effectively as a narrow band filter than an FBG with a constant average index. An FBG with a varying average index of refraction can also result in increased insertion loss associated with the grating.

Accordingly, in some aspects, the invention features methods and systems for writing FBG's having a constant average index of refraction. More generally, the methods and systems of the invention can be used to write more complex refractive index patterns than Bragg gratings in a variety of photosensitive media. These methods and systems may be used to create regular or complex optical structures in any appropriate medium, such as doped glasses and photosensitive polymers.

In general, in a first aspect, the invention features a method for writing apodized fiber Bragg gratings in an optical fiber having a photosensitive core. The method includes exposing a first portion of the photosensitive core to an interference pattern for a first period to cause an amplitude modulation in the refractive index of the first portion, and exposing the first portion to the interference pattern for a second period while oscillating the position of the radiation pattern with respect to the photosensitive core to change the average refractive index modulation of the first portion of the medium, wherein the first and second periods are selected so that the first portion comprises a portion of an apodized fiber Bragg grating.

Embodiments of the method can include one or more features of other aspects of the invention.

In a second aspect, the invention features a method, including exposing a first portion of a photosensitive medium to a radiation pattern for a first period to cause an amplitude modulation in the refractive index of the first portion, and exposing the first portion to the radiation pattern for a second period while oscillating the position of the radiation pattern with respect to the photosensitive medium to change the average refractive index of the first portion of the medium.

Embodiments of the method can include one or more of the following features, and/or features of other aspects of the invention.

The method can further include exposing a second portion of the photosensitive medium to the radiation pattern, wherein the second portion is different from the first portion. An intensity of the radiation pattern can be scanned so that an amplitude of the refractive index modulation of the first portion is different from an amplitude of a refractive index modulation of the second portion. The method can further include exposing the second portion to the radiation pattern while oscillating the position of the radiation pattern with respect to the photosensitive medium. The exposures can cause an average local refractive index of the first portion is equal to an average local index of the second portion.

In some embodiments, the method includes scanning an intensity of the radiation pattern across a region of the photosensitive medium. The intensity of the radiation pattern can be scanned with a varying velocity. For example, the intensity of the radiation pattern can be scanned with a first velocity dependence prior to oscillating, and a second velocity dependence during the oscillating, and the first velocity dependence is different from the second velocity dependence. The first velocity dependence can be related to the inverse of the second velocity dependence.

The first period can precede the second period, or vice versa.

In some embodiments, the radiation pattern is an interference pattern. The interference pattern can have a spatial period between about 100 nm and 1,000 nm.

Exposing the first portion to the radiation pattern can include directing a first beam and a second beam to interfere at the photosensitive medium to form the radiation pattern. In some embodiments, exposing the first portion includes diffracting a source beam to form the first and second beams. In such embodiments, the first and second beams can be first order diffracted beams. In some embodiments, the radiation pattern is oscillated by dithering an optic that directs at least one of the first and second beams to the photosensitive medium. The optic can be a diffractive mask (e.g., a phase mask) that separates the source beam into first and second beams.

Exposing the first portion can include illuminating a waveguide (e.g., an optical fiber) with the radiation pattern, and the waveguide comprises the photosensitive medium. The amplitude modulation in the refractive index of the first portion can include a Bragg grating (e.g., an apodized Bragg grating).

In a further aspect, the invention features an apparatus, including an exposure system configured to illuminate a target with an interference pattern, the exposure system including an optical element and a dither stage which is capable of selectively dithering the optical element to cause the position of the interference pattern at the target to oscillate. The apparatus also includes a stage for positioning a photosensitive medium at the target, and an electronic controller in communication with the exposure system. During operation of the apparatus, the electronic controller causes the exposure system to expose a first portion of the photosensitive medium at the target to the interference pattern for a first period without dithering the optical element and for a second period dithering the an optical element.

Embodiments of the apparatus can include one or more of the following features, and/or features of other aspects.

The exposure system can further include a light directing optic configured to direct illumination toward the optical element and a scanning stage capable of scanning the light directing optic to cause the intensity of the interference pattern at a position on the target to vary. The exposure system can also include a source configured toward direct illumination (e.g., ultra violet radiation and/or visible radiation) to the light directing optic.

The stage can be configured to position a waveguide (e.g., an optical fiber or a planar waveguide) at the target, and the waveguide can include the photosensitive medium.

In some embodiments, the stage is configured to position a planar photosensitive medium (e.g., a layer of photoresist) at the target.

The optical element can be a phase mask or an amplitude mask.

Embodiments of the invention may include one or more of the following advantages.

Embodiments of the invention can be used to flexibly apodize many grating structures. This flexibility can be provided by varying the scan profile and/or dither profile of an interference pattern across a target area, for example. For each exposure region, the scan profile can be selected to provide a desired average refractive index and index modulation amplitude. In some embodiments, a user can select different scan profiles in drive software, without any modification of the exposure optics or other hardware.

Implementations of the invention can also he adapted to write apodized gratings and other optical structures in, for example, planar waveguide structures, apodized phase masks and/or other types of diffraction gratings using a variety of two-beam holographic apparatus. In some embodiments, the exposure apparatus can be readily adapted for different media by replacing the stage that positions the medium with respect to the interference pattern. Depending on the desired exposure pattern and medium, a user can also readily change the phase mask, or other optical component(s), used to create the interference pattern.

In some cases, systems for writing the apodized gratings do not require substantial fine adjustment, handling of critical components, and/or handling of the target between successive exposures. For example, the exposure can be varied between one that varies the refractive index modulation amplitude (an "AC" scan) and one that varies the average refractive index of the exposed region (a "DC" scan) without adjusting or changing any of the optical components or the target. After initial setup, most adjustment to the scan profile is handled by the drive software, which selects the exposure region using the scan stage and by switching between AC and DC scans with the dither stage.

In addition, some embodiments can allow for gradual buildup of the grating pattern by means of multiple scans. Moreover, embodiments can simplify modifying the average index of portions of a photosensitive medium next to a grating to reduce variations between the average refractive index of the grating and other portions of the photosensitive medium by exposing these portions to a DC exposure.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
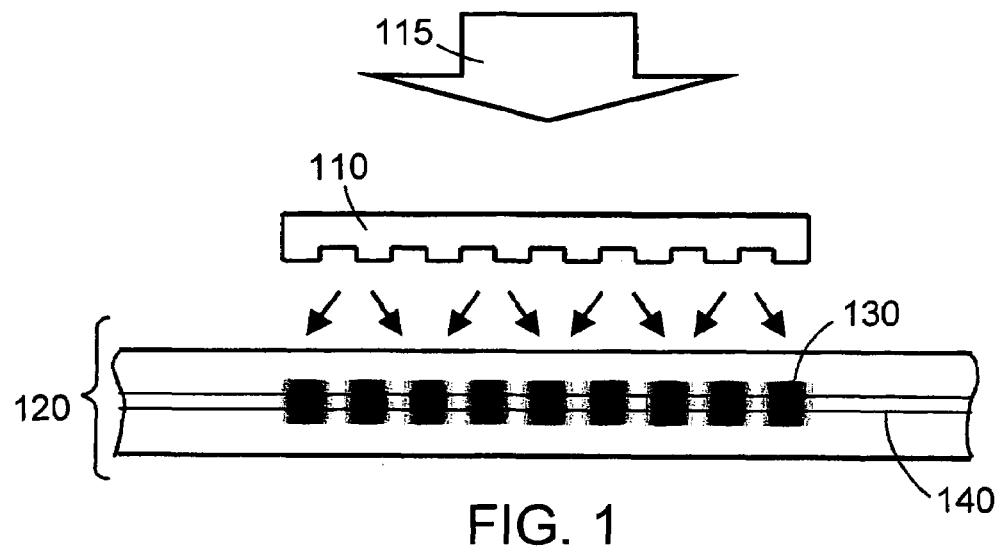
FIG. 1 is a schematic diagram of an embodiment of a technique for creating an FBG in a photosensitive fiber.
Figure 2:
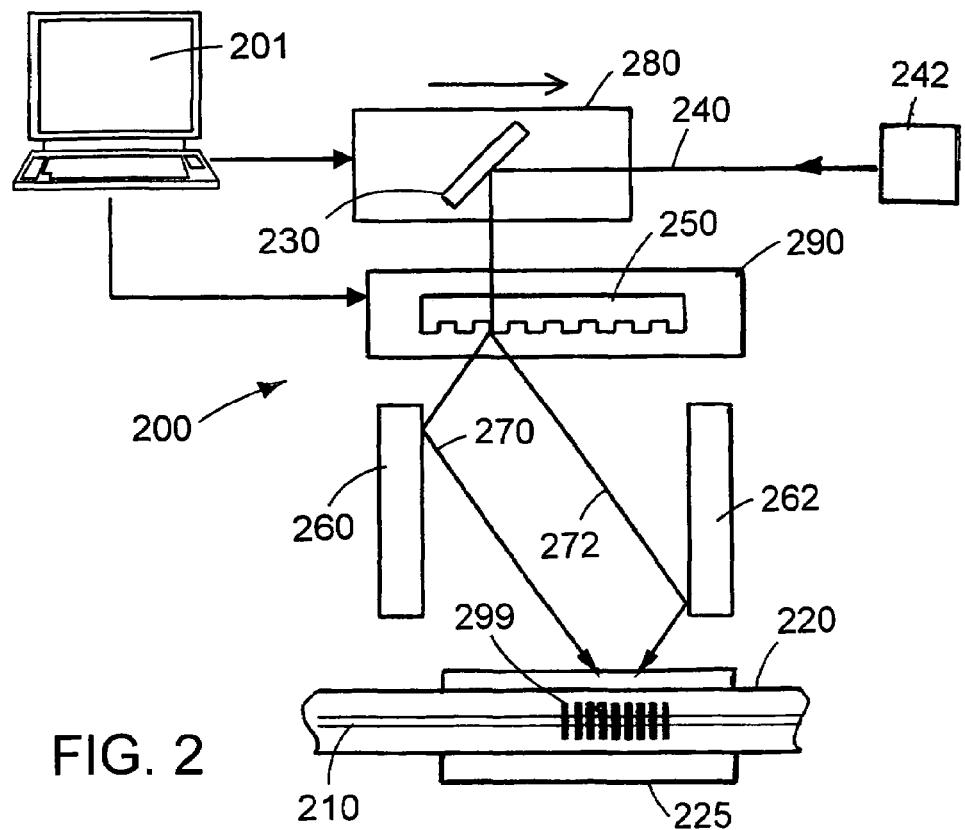
FIG. 2 is a schematic diagram of an embodiment of a fiber Bragg grating exposure system.

Referring to FIG. 2, a grating exposure system 200 is used to write an apodized grating in a photosensitive core 210 of an optical fiber 220 (e.g., a single mode optical fiber). During a series of exposures, a scanning mirror 230 directs a beam 240 from an illumination source 242 towards a phase mask 250. Phase mask 250 is optimized to direct beam 240 into two first-order diffracted beams, beam 270 and beam 272. Beam 270 is the negative first-order beam and beam 272 is the positive first-order beam. Beams 270 and 272 are of approximately equal intensity. Optical fiber 220 is mounted on an exposure stage 225, which positions the fiber relative to scanning mirror 230 and phase mask 250.

Mirrors 260 and 262 redirect diffracted beams 270 and 272, respectively, towards a portion of optical fiber 220. Beams 270 and 272 overlap at the portion of the optical fiber 220 and interfere to form an interference pattern 299. Interference pattern 299 causes a change in the refractive index of the exposed portion of core 210. The refractive index at a position in the core is related to the total exposure at that position of incident illumination from source 242 (e.g., the refractive index can be proportional to the total exposure at that position). Hence, the illumination interacts with the core to produce a refractive index modulation in the exposed portion.

Mirror 230 is mounted on a scanning stage 280 that translates mirror 230 parallel to the axis of optical fiber 220. A translation of scanning mirror 230 causes the intensity of the interference pattern vary in a direction parallel to the fiber axis, and hence allows system 200 to expose different portions at different lateral positions of optical fiber 220. Provided phase mask 250 is stationary, scanning the scanning mirror affects the relative intensity of radiation in each interference fringe, but not the location of the interference fringes on the fiber. A computer 201, in communication with scanning stage 280, controls the position of interference pattern 299 with respect to optical fiber 220 and controls the length of time each portion of optical fiber 220 is exposed.

A dither stage 290 supports phase mask 250. During certain exposures, dither stage 290 rapidly oscillates phase mask 250 with respect to beam 240. This movement causes the position of interference pattern 299 to oscillate about a point on optical fiber 220, blurring the interference fringes on the exposed portion of the fiber. Computer 201 is also in communication with dither stage 290 and controls the duration, amplitude, and frequency of the oscillation.

The dither stage oscillation frequency can be varied as desired. In some embodiments, the oscillation frequency is sufficiently high so that the oscillation period is substantially shorter than the time it takes for the interference pattern to change the refractive index of the photosensitive core. Thus, during an exposure with the dither stage on, the total exposure of a position on the photosensitive medium is averaged over multiple oscillations. In some embodiments, the oscillation frequency can be at least one Hz (e.g., more than five Hz, more than 10 Hz, such as about 100 Hz or more). Typically, the oscillation frequency will depend on the intensity of beam 240, the exposure area, and the sensitivity of photosensitive core 210 to interference pattern 299. For example, suppose the exposure area at a given instant is 1 millimeter wide on the fiber, and the scan speed of the scanning stage is 0.1 millimeters per second. A dither rate of 10 Hz would cause the interference pattern to oscillate back and forth 100 times during the exposure of the 1 millimeter area. For most materials, this would sufficiently "wash out" the interference pattern, and not result in an index modulation in the exposed area. More generally, the oscillation should be rapid with respect to the dwell time of the exposure area on a particular position on the fiber.

The amplitude of the dither oscillation can vary. Typically, the dither oscillation amplitude is on the order of the spatial period of interference pattern 299 so that the average exposure is approximately constant over each grating period. For example, for a fiber Bragg grating designed to reflect an optical signal having a wavelength of about 1,500 nm, the oscillation amplitude can be at least 500 nm, such as between 1,000 nm and 2,000 nm. Accordingly, when integrated over the exposure period, the effect of the oscillation is to blur the interference fringes, and the exposure is equivalent to exposing the portion to a beam that has a spatially uniform intensity across the length scale of the interference pattern fringes.

In general, light source 242 provides illumination at a wavelength to which core 210 is sensitive (i.e., the illumination interacts with the core, or a component material of the core, to permanently change the core's refractive index). For example, UV light can be used for a silica core doped with germanium oxide. In some embodiments, longer wavelengths can be used. For example, certain polymers can be sensitized to visible wavelengths (e.g., 400 nm to 600 nm or 700 nm) by doping them with a suitable photoinitiator. For example, some acrylate monomers can be sensitized to visible wavelengths by doping with Rose Bengal.

Light source 242 also produces radiation with sufficient spatial coherence so that beams 270 and 272 form the desired interference pattern at the exposed portion of fiber 220. In preferred embodiments, light source 242 provides illumination with sufficient intensity to write the Bragg grating in each portion of fiber 220 in a reasonably short time, such as 10 minutes or less (e.g., less than 1 minute). Examples of suitable light sources include lasers, such as pulsed and continuous wave lasers. Such lasers include solid-state, alexandrite lasers, which can produce narrow-band radiation at 248 nm, 193 nm and other UV wavelengths.

Although phase mask 250 is optimized to direct maximal intensity into the +1 and −1 diffracted orders, other phase masks can be used. For example, phase mask 250 can be selected to diffract equal intensity into the zeroth and first orders. More generally, phase mask 250 can be any diffractive component(s) capable of forming a desired intensity pattern on optical fiber 220 (e.g., phase mask, amplitude mask, or combination) interference pattern.

In some embodiments, phase mask 250 can be replaced with any optical component or components capable of splitting beam 240 into two or more coherent beams of appropriate intensity to form the desired interference pattern on optical fiber 220. For example, suitable components for splitting beam 240 include various polarizing or non-polarizing beam splitters. Additional optical components (e.g., mirrors and/or phase plates) may be used in combination with the beam splitting optic(s) to ensure that the resulting beams are incident on fiber 220 at appropriate angles to form the desired interference pattern.

An exposure sequence for writing an apodized Bragg grating in core 210 includes at least two exposure steps: one with dither stage 290 turned off; and one with dither stage 290 on. The exposure with the dither stage off provides the modulation in the core's refractive index, and is referred to as an "AC" exposure. The AC exposure results in a modulation of the local refractive index. Here, "local" refers the refractive index averaged over several grating periods (e.g., more than one grating period, such as about five grating periods). The exposure with dither stage 290 on affects the average local index of the exposed portion of the core, and is referred to as a "DC" exposure.

During each exposure, scanning stage 280 scans mirror 230 parallel to the optical fiber axis, thereby varying the intensity of interference pattern 299 at different regions of the of optical fiber 220. While the dither stage is off, the interference pattern remains stationary, and the scanning changes the amount of light sent to a particular portion of the pattern.

Assuming one wishes to apodize the AC portion of the exposure according to an amplitude function A(x), that varies at most between zero and one, one way to calculate a velocity that approximates this function is to use:

$$v_{AC}(x) = \frac{v_0}{A(x) + v_0/v_{max}}$$

where $v_0$ is the velocity selected to correspond to an amplitude $A(x)=1$, and $v_{max} \gg v_0$ is the maximum stage velocity consistent with precision control of the stage. Here, x denotes position along the axis of optical fiber 220. The value of $v_0$ depends on the total exposure time desired.

Figure 3:
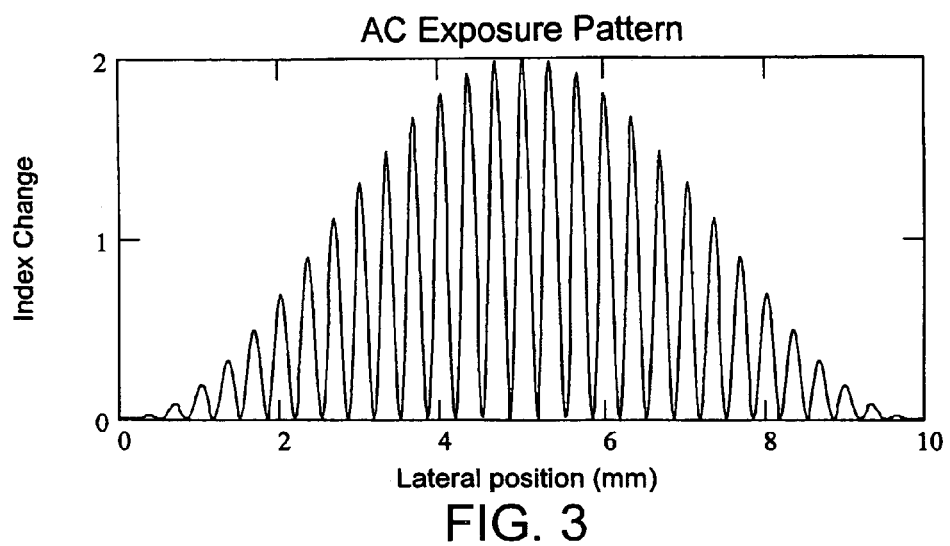
FIG. 3 is a plot of a refractive index profile for an AC exposure scan. In this plot, relative refractive index change is shown as a function of lateral position along the optical fiber.

Referring to FIG. 3, a plot of an example exposure profile using an amplitude function given by $$A(x)=\cos^2(x-x_0),$$

where $x_0$ is the midpoint of the lateral scan. The wavelength of the refractive index modulation corresponds to the fringe spacing of the interference pattern, and is constant along the length of the grating. Assuming the intensity of illumination is constant for the exposure, this scan profile results in a maximum exposure time at the lateral position of five mm, the grating midpoint. Correspondingly, the index modulation has maximum amplitude at this point. The grating has the shortest AC exposure at its endpoints, zero mm and 10 mm. Accordingly, the modulation amplitude of the refractive index profiles is smallest at these points.

The average local index of refraction of the grating corresponds approximately to the midpoint between adjacent peaks and troughs. Because the peak index varies as a function of lateral position, but not the trough index, the average local index also varies as a function of lateral position along the grating. The Bragg reflection wavelength is dependent on both the modulation wavelength and the average local index of refraction. Because the modulation wavelength remains constant, the varying average local index results in what is usually an undesirable dependence of the Bragg wavelength on lateral position x within the grating.

Figure 4:
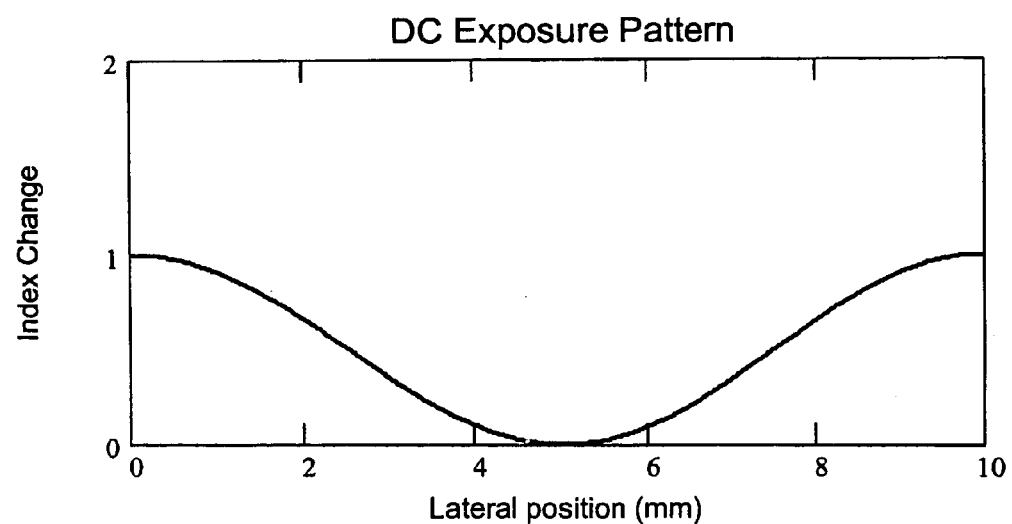
FIG. 4 is a plot of an example of relative index change as a function of lateral position along the optical fiber for a DC scan.

To compensate for the modulation of the average local index generated during the AC exposure, optical fiber 220 is exposed to the interference pattern a second time with the dither stage activated. The dither stage effectively blurs out the intensity fringes of interference pattern 299. In order to correctly compensate the average local index variation, the resulting DC exposure has a velocity dependence that is essentially the inverse of the AC pattern. Thus $$v_{DC}(x) = \frac{v_0}{\overline{A}(x) + v_0/v_{\max}}$$

where $$\overline{A}(x) = 1 - A(x)$$

is the complementary amplitude function to A(x). An example of a DC exposure profile for compensating the refractive index profile shown in FIG. 3 is shown in FIG. 4. The DC exposure increases the average local refractive index most at the grating endpoints, while not affecting the average local index at the grating midpoint.

Figure 5:
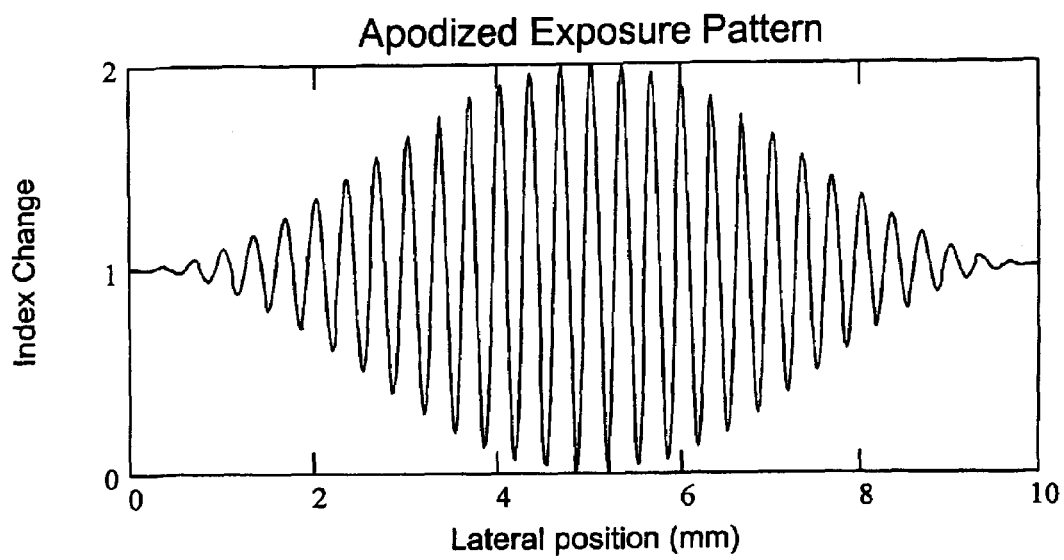
FIG. 5 is plot of the final, net refractive index profile resulting from sequential DC and AC scans, i.e., the sum of FIG. 3 and FIG. 4.

Referring to FIG. 5, after the AC and the DC exposures, the average local index is constant over the grating, whereas the refractive index modulation amplitude varies according to the squared cosine apodization function.

Figure 6:
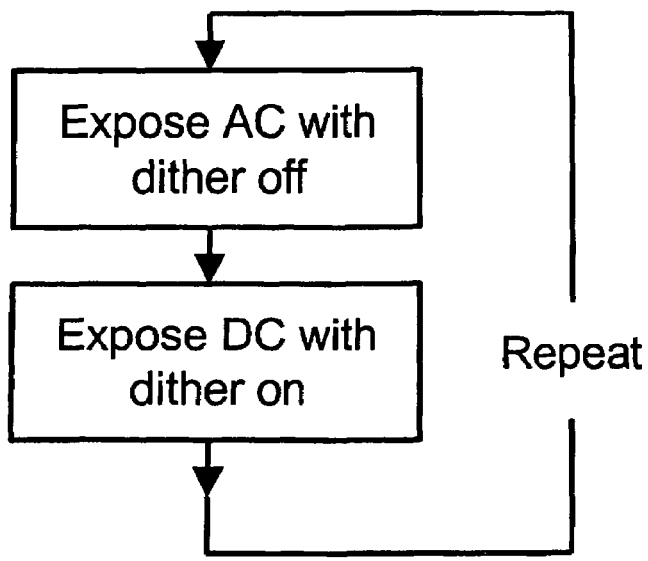
FIG. 6 is a flowchart of an embodiment of a method of the invention.

The exposure sequence described above may be repeated many times to gradually build up the grating image in the target. The process is summarized by the flow chart shown in FIG. 6. In some embodiments, multiple scans can allow intense energy of the UV beam to be absorbed more gradually and uniformly, with less local rise in temperature, than a single sequence of AC and DC scans. Using the described method, one may, for example, scan the exposing beam dozens of times across the target, alternating DC and AC scans.

Other implementations can include scanning/dithering schemes in which a single portion of the fiber is exposed to the interference pattern in AC and DC mode before translating mirror 230 to expose adjacent portions. In such implementations, the refractive index modulation amplitude is determined by the amount of time the mirror is stationary.

For applications where it is important to make the average index constant, one can expose the target first in AC mode then DC mode. However, in some embodiments, the target can be exposed in a DC mode first. Furthermore, while the foregoing describes an exposure sequence including alternating AC and DC exposures, other exposure sequences can also be used. For example, the target can be exposed to a sequence of AC exposures. The scan profile for each exposure can be the same or different. Alternatively, or additionally, the target can be exposed to multiple consecutive DC exposures. In some embodiments, during sequential DC exposures, the dither stage can oscillate the phase mask at different frequencies and/or amplitudes.

Although the described embodiment utilizes a scan profile that produces a cosine-squared dependence of the refractive index modulation amplitude on lateral positions, other scan profiles can also be used. In general, one may select any scan profile that provides an exposure corresponding to a desired index profile. For example, the scan velocity can be made to vary linearly, quadratically, or corresponding to some higher order polynomial function. Alternatively, or additionally, the scan profile can include stationary periods.

Obvious alternative techniques consistent with the inventive method include replacing the dither stage with equivalent means of blurring the interference pattern resulting in a DC exposure pattern. For example, phase mask 250 may be mounted on a fixed stage, and mirrors 260 and 262 and/or exposure stage 225 can be dithered to thereby oscillate the position of the radiation pattern.

Furthermore, while the described embodiment involves forming an apodized grating in an optical fiber, the described techniques can also be applied to write gratings in other photosensitive media. For example, these techniques can be used to write apodized gratings in planar waveguide structures. More generally, these techniques can be applied to modify the average local refractive index of any photosensitive medium, such as polymeric photopolymer films and/or photoresists. These techniques can also be applied to interference patterns formed form more than two beams (e.g., three or more beams), and from interference patterns formed from non-planar, complex wavefronts.

A number of embodiments of the invention have been described. Nevertheless, it will be understood that various modifications may be made without departing from the spirit and scope of the invention. For example, embodiments of the invention are not limited to forming periodic structures electromagnetic radiation. In general, any sufficiently coherent radiation can be used, including, for example, electron beams. Accordingly, other embodiments are within the scope of the following claims.

What is claimed is:

1. A method for writing apodized fiber Bragg gratings in an optical fiber having a photosensitive core, the method comprising:

exposing a first portion of the photosensitive core to an interference pattern for a first period to cause an amplitude modulation in the refractive index of the first portion, where the interference pattern is formed using a diffractive optical element; and exposing the first portion to the interference pattern for a second period while oscillating the position of the interference pattern with respect to the photosensitive core to change the average refractive index modulation of the first portion of the medium, wherein the first and second periods are selected so that the first portion comprises a portion of an apodized fiber Bragg grating, and oscillating the position of the radiation pattern comprises dithering the diffractive optical element.

2. A method, comprising:

exposing a first portion of a photosensitive medium to a radiation pattern for a first period to cause an amplitude modulation in the refractive index of the first portion, where the radiation pattern is formed using a diffractive optical element; and exposing the first portion to the radiation pattern for a second period while oscillating the position of the radiation pattern with respect to the photosensitive medium to change the average refractive index of the first portion of the mediums, wherein oscillating the position of the radiation pattern comprises dithering the diffractive optical element.

3. The method of claim 2, further comprising exposing a second portion of the photosensitive medium to the radiation pattern, the second portion being different from the first portion.

4. The method of claim 3, wherein an intensity of the radiation pattern is scanned so that an amplitude of the refractive index modulation of the first portion is different from an amplitude of a refractive index modulation of the second portion.

5. The method of claim 3, further comprising exposing the second portion to the radiation pattern while oscillating the position of the radiation pattern with respect to the photosensitive medium.

6. The method of claim 5, wherein the exposures cause an average local refractive index of the first portion is equal to an average local index of the second portion.

7. The method of claim 2, further comprising scanning an intensity of the radiation pattern across a region of the photosensitive medium.

8. The method of claim 7, wherein the intensity of the radiation pattern is scanned with a varying velocity.

9. The method of claim 8, wherein the intensity of the radiation pattern is scanned with a first velocity dependence prior to oscillating, and a second velocity dependence during the oscillating, and the first velocity dependence is different from the second velocity dependence.

10. The method of claim 9, wherein the first velocity dependence is related to the inverse of the second velocity dependence.

11. The method of claim 2, wherein the first period precedes the second period.

12. The method of claim 2, wherein the second period precedes the first period.

13. The method of claim 2, wherein the radiation pattern is an interference pattern.

14. The method of claim 13, wherein the interference pattern has a spatial period between about 100 nm and 1,000 nm.

15. The method of claim 2, wherein exposing the first portion to the radiation pattern includes directing a first beam and a second beam to interfere at the photosensitive medium to form the radiation pattern.

16. The method of claim 15, wherein exposing the first portion comprises diffracting a source beam using the diffractive optical element to form the first and second beams.

17. The method of claim 16, wherein the first and second beams are first order diffracted beams.

18. The method of claim 15, wherein the diffractive optical element separates the source beam into first and second beams.

19. The method of claim 18, wherein the diffractive optical element is a phase mask.

20. The method of claim 2, wherein exposing the first portion comprises illuminating a waveguide with the radiation pattern, and the waveguide comprises the photosensitive medium.

21. The method of claim 20, wherein the waveguide comprises an optical fiber.

22. The method of claim 20, wherein the amplitude modulation in the refractive index of the first portion comprises a Bragg grating.

23. The method of claim 22, wherein the Bragg grating comprises an apodized Bragg grating.

24. An apparatus, comprising:

an exposure system configured to illuminate a target with an interference pattern, the exposure system comprising a diffractive optical element and a dither stage configured to selectively dither the diffractive optical element to cause the position of the interference pattern at the target to oscillate;

a stage for positioning a photosensitive medium at the target;

an electronic controller, in communication with the exposure system, which during operation causes the exposure system to expose a first portion of the photosensitive medium at the target to the interference pattern for a first period without dithering the diffractive optical element and for a second period dithering the diffractive optical element.

25. The apparatus of claim 24, wherein the exposure system further comprises a light directing optic configured to direct illumination toward the optical element and a scanning stage capable of scanning the light directing optic to cause the intensity of the interference pattern at a position on the target to vary.

26. The apparatus of claim 25, wherein the exposure system further comprises a source configured toward direct illumination to the light directing optic.

27. The apparatus of claim 26, wherein the source is capable of emitting illumination comprising ultra violet radiation.

28. The apparatus of claim 26, wherein the source is capable of emitting illumination comprising visible radiation.

29. The apparatus of claim 24, wherein the stage is configured to position a waveguide at the target, and the waveguide comprises the photosensitive medium.

30. The apparatus of claim 29, wherein the waveguide comprises an optical fiber.

31. The apparatus of claim 29, wherein the waveguide comprises a planar waveguide.

32. The apparatus of claim 24, wherein the stage is configured to position a planar photosensitive medium at the target.

33. The apparatus of claim 32, wherein the planar photosensitive medium comprises a photoresist material.

34. The apparatus of claim 24, wherein the diffractive optical element is a phase mask.

35. The apparatus of claim 24, wherein the diffractive optical element is an amplitude mask.

36. A method, comprising:

overlapping a first beam and a second beam to form an interference pattern, wherein the first and second beams are derived from a common source and directed along different paths and the first beam contacts at least one optical element prior to overlapping with the second beam;

exposing a photosensitive medium to the interference pattern for a first period to cause an amplitude modulation in the refractive index of the photosensitive medium; and exposing the photosensitive medium to the interference pattern for a second period while oscillating the position of the radiation pattern with respect to the photosensitive medium to change the average refractive index of the photosensitive medium.

37. The method of claim 36, wherein overlapping the first and second beams comprises diffracting a source beam using a diffractive optical element to form the first and second beams.

38. The method of claim 37, wherein oscillating the position of the radiation pattern comprises dithering the diffractive optical element.

39. The method of claim 36, wherein the optical element is a reflective optical element.

40. The method of claim 36, wherein both the first and second beams contact respective optical elements prior to overlapping.

41. The method of claim 36, further comprising blocking the first beam to expose the photosensitive medium to non-interfering radiation from the second beam.

42. An apparatus, comprising:
an exposure system configured to direct a first beam and a second beam from a common source to form an interference pattern at a target, the exposure system comprising a first optical element, a second optical element and a dither stage configured to selectively dither the first optical element to vary the paths of the first and second beams to the target and cause the position of the interference pattern at the target to oscillate, wherein the first beam contacts the second optical element prior to forming the interference pattern;

a stage for positioning a photosensitive medium at the target;

an electronic controller, in communication with the exposure system, which during operation causes the exposure system to expose a first portion of the photosensitive medium at the target to the interference pattern for a first period without dithering the optical element and for a second period dithering the optical element.

43. The apparatus of claim 42, wherein the first optical element is a diffractive optical element.

44. The apparatus of claim 42, wherein the second optical element is a reflective optical element.

45. An apparatus, comprising:
an exposure system configured to illuminate a target with an interference pattern, the exposure system comprising an optical element and a translation stage configured to selectively translate the optical element with respect to the target to cause the position of the interference pattern at the target to oscillate;

a stage for positioning a photosensitive medium at the target;

an electronic controller, in communication with the exposure system, which during operation causes the exposure system to expose a first portion of the photosensitive medium at the target to the interference pattern for a first period without dithering the optical element and for a second period dithering the optical element.

* * * * *